(12) United States Patent
Chen et al.

(10) Patent No.: US 11,380,627 B1
(45) Date of Patent: Jul. 5, 2022

(54) RADIOFREQUENCY DEVICE

(71) Applicant: United Semiconductor (Xiamen) Co., Ltd., Fujian (CN)

(72) Inventors: Hui Feng Chen, Fujian (CN); Guang Yang, Fujian (CN); Jinjian Ouyang, Fujian (CN); Linshan Yuan, Fujian (CN); Chin-Chun Huang, Hsinchu County (TW); Wen Yi Tan, Fujian (CN)

(73) Assignee: United Semiconductor (Xiamen) Co., Ltd., Fujian (CN)

(*) Notice: Subject to any disclaimer, the term of this patent is extended or adjusted under 35 U.S.C. 154(b) by 0 days.

(21) Appl. No.: 17/308,038

(22) Filed: May 4, 2021

(30) Foreign Application Priority Data

Apr. 12, 2021 (CN) .......................... 202110388847.1

(51) Int. Cl.
| | |
|---|---|
| *H01L 23/552* | (2006.01) |
| *H01L 29/40* | (2006.01) |
| *H01L 23/522* | (2006.01) |
| *H01L 27/092* | (2006.01) |

(52) U.S. Cl.
CPC ........ *H01L 23/552* (2013.01); *H01L 23/5227* (2013.01); *H01L 29/402* (2013.01); *H01L 27/092* (2013.01)

(58) Field of Classification Search
CPC . H01L 23/552; H01L 23/5527; H01L 29/402; H01L 23/5225; H01L 28/10; H01L 27/092; H01L 23/5286

USPC .......................................... 257/531; 438/951
See application file for complete search history.

(56) References Cited

U.S. PATENT DOCUMENTS

| | | |
|---|---|---|
| 2004/0195650 A1 | 10/2004 | Yang |
| 2016/0285418 A1* | 9/2016 | Jones et al. ........... H03F 1/0205 |
| | | 330/250 |

FOREIGN PATENT DOCUMENTS

| | | |
|---|---|---|
| CN | 101635299 A | 1/2010 |
| CN | 106601753 A | 4/2017 |
| CN | 110634864 A | 12/2019 |

* cited by examiner

*Primary Examiner* — Thinh T Nguyen
(74) *Attorney, Agent, or Firm* — Winston Hsu

(57) ABSTRACT

A radiofrequency device includes a semiconductor substrate, an inductor structure, a shielding structure, and a mask pattern. The semiconductor substrate includes a first region and a second region. The inductor structure is disposed on the first region of the semiconductor substrate. The shielding structure is disposed on the first region of the semiconductor substrate and located between the inductor structure and the semiconductor substrate in a vertical direction. The mask pattern is disposed on the semiconductor substrate. A first portion of the mask pattern is disposed on the shielding structure and directly contacts the shielding structure, and a top surface of the shielding structure is completely covered by the first portion of the mask pattern.

20 Claims, 7 Drawing Sheets

US 11,380,627 B1

RADIOFREQUENCY DEVICE

BACKGROUND OF THE INVENTION

1. Field of the Invention

The present invention relates to a radiofrequency device, and more particularly, to a radiofrequency device including an inductor structure.

2. Description of the Prior Art

The micro-processor system comprised of integrated circuits (IC) is a ubiquitous device, being utilized in such diverse fields as automatic control electronics, mobile communication devices and personal computers. With the development of technology and the increasingly imaginative applications of electrical products, the IC device is becoming smaller, more delicate and more diversified.

In the modern society, current semiconductor devices often include radiofrequency (RF) circuit structures to perform wireless communication capabilities. In the RF device, the energy efficiency of the device will be influenced by the quality factor (Q-factor) of the inductor directly. Therefore, how to improve the Q-factor of the RF device through design modifications in the structure and/or process is still a continuous issue for those in the related fields.

SUMMARY OF THE INVENTION

A radiofrequency device is provided in the present invention. A shielding structure located under an inductor structure is covered by a mask pattern for reducing energy loss and improving Q-factor of the inductor structure.

According to an embodiment of the present invention, a radiofrequency device is provided. The radiofrequency device includes a semiconductor substrate, an inductor structure, a shielding structure, and a mask pattern. The semiconductor substrate includes a first region and a second region. The inductor structure is disposed on the first region of the semiconductor substrate. The shielding structure is disposed on the first region of the semiconductor substrate and located between the inductor structure and the semiconductor substrate in a vertical direction. The mask pattern is disposed on the semiconductor substrate. A first portion of the mask pattern is disposed on the shielding structure and directly contacts the shielding structure, and a top surface of the shielding structure is completely covered by the first portion of the mask pattern.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-7 are schematic drawings illustrating a manufacturing method of a radiofrequency device according to the first embodiment of the present invention, wherein FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
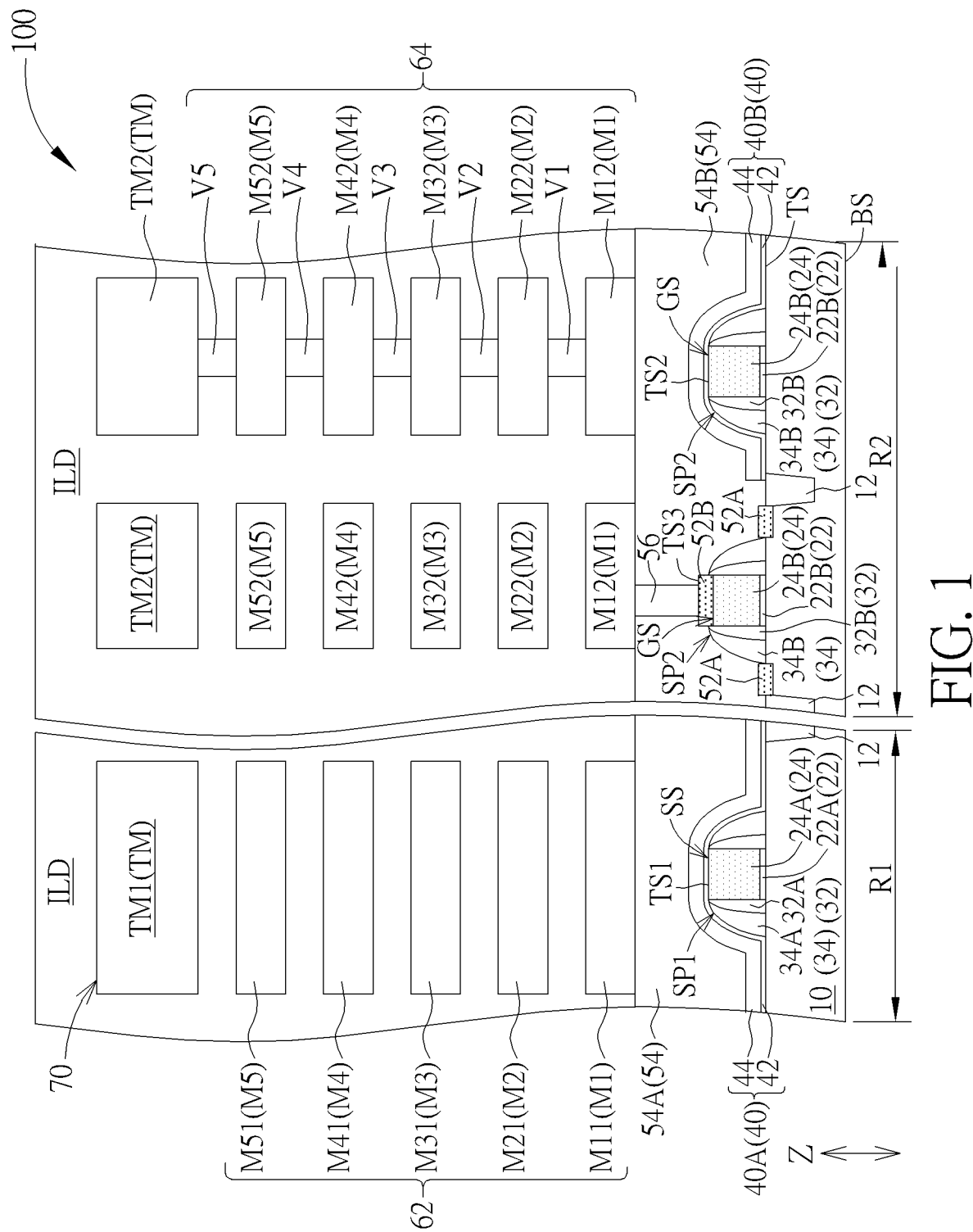
FIG. 1 is a schematic drawing illustrating a radiofrequency device according to an embodiment of the present invention.

Please refer to FIG. 1. FIG. 1 is a schematic drawing illustrating a radiofrequency device 100 according to an embodiment of the present invention. As shown in FIG. 1, the radiofrequency device 100 includes a semiconductor substrate 10, an inductor structure 70, a shielding structure SS, and a mask pattern 40. The semiconductor substrate 10 includes a first region R1 and a second region R2. The inductor structure 70 is disposed on the first region R1 of the semiconductor substrate 10. The shielding structure SS is disposed on the first region R1 of the semiconductor substrate 10 and located between the inductor structure 70 and the semiconductor substrate 10 in a vertical direction Z. The mask pattern 40 is disposed on the semiconductor substrate 10. A first portion 40A of the mask pattern 40 is disposed on the shielding structure SS and directly contacts the shielding structure SS, and a top surface TS1 of the shielding structure SS is completely covered by the first portion 40A of the mask pattern 40.

In some embodiments, the shielding structure SS located under the inductor structure may be made of an electrically conductive material for blocking electric field lines from penetrating the semiconductor substrate 10 and reducing coupling capacitance between the inductor structure 70 and the semiconductor substrate 10. In the present invention, the mask pattern 40 covering the shielding structure SS may be used to reduce energy loss and increasing coupling resistance between the inductor structure 70 and the structure underneath the inductor structure 70, and the quality factor (Q-factor) of the inductor structure 70 may be enhanced accordingly.

In some embodiments, the vertical direction Z described above may be regarded as a thickness direction of the semiconductor substrate 10. The semiconductor substrate 10 may have a top surface TS and a bottom surface BS opposite to the top surface TS in the vertical direction Z, and the inductor structure 70, the shielding structure SS, and the mask pattern 40 may be disposed at a side of the top surface TS, but not limited thereto. A horizontal direction orthogonal to the vertical direction Z may be substantially parallel with the top surface TS of the semiconductor substrate 10 and/or the bottom surface BS of the semiconductor substrate 10.

Additionally, in this description, a distance between the bottom surface BS of the semiconductor substrate 10 and a relatively higher location and/or a relatively higher part in the vertical direction Z is greater than a distance between the bottom surface BS of the semiconductor substrate 10 and a relatively lower location and/or a relatively lower part in the vertical direction Z. The bottom or a lower portion of each component may be closer to the bottom surface BS of the semiconductor substrate 10 in the vertical direction Z than the top or an upper portion of this component. Another component disposed above a specific component may be regarded as being relatively far from the bottom surface BS of the semiconductor substrate 10 in the vertical direction Z, and another component disposed under a specific component may be regarded as being relatively closer to the bottom surface BS of the semiconductor substrate 10 in the vertical direction Z.

Specifically, in some embodiments, the radiofrequency device 100 may further include an isolation structure 12, at least one gate electrode GS, a first spacer structure (such as a spacer structure SP2 shown in FIG. 1), and a second spacer structure (such as a spacer structure SP1 shown in FIG. 1). At least a part of the isolation structure 12 may be disposed in the semiconductor substrate 10 for defining a plurality of areas separated from one another in the semiconductor substrate 10, such as defining a plurality of active areas in the second region R2 of the semiconductor substrate 10, but not limited thereto. The gate structure GS may be disposed on the second region R2 of the semiconductor substrate 10, the spacer structure SP1 may be disposed on a sidewall of the shielding structure SS, and the spacer structure SP2 may be disposed on a sidewall of the gate structure GS. In some embodiments, a material composition of the spacer structure SP1 may be identical to a material composition of the spacer structure SP2, but not limited thereto. For example, a first spacer 32 and a second spacer 34 may be disposed on the first region R1 and the second region R2 of the semiconductor substrate 10, and the second spacer 34 may be disposed on the first spacer 32. The spacer structure SP1 may include a first portion 32A of the first spacer 32 and a first portion 34A of the second spacer 34, and the spacer structure SP2 may include a second portion 32B of the first spacer 32 and a second portion 34B of the second spacer 34. The first spacer 32 and the second spacer 34 may respectively include a single layer or multiple layers of insulation materials, such as silicon oxide, silicon nitride, or other suitable insulation materials.

In some embodiments, the first portion 40A of the mask pattern 40 may be conformally disposed on the shielding structure SS and the spacer structure SP1, and a second portion 40B of the mask pattern 40 may be conformally disposed on the gate structure GS, the spacer structure SP2, and the second region R2 of the semiconductor substrate 10. It is worth noting that, in some embodiments, a plurality of the gate structures GS may be disposed on the second region R2 of the semiconductor substrate 10, and the two gate structures GS illustrated in FIG. 1 may be two gate structures GS separated from each other or correspond to cross-sectional conditions of different portions in the same gate structure GS. Therefore, the gate structure GS may be partially covered by the second portion 40B of the mask pattern 40, and the gate structure GS is not completely covered by the second portion 40B of the mask pattern 40.

The mask pattern 40 may include a single layer or multiple layers of insulation materials, such as silicon oxide, silicon nitride, silicon oxynitride, or other suitable insulation materials. In some embodiments, the mask pattern 40 may include a first insulation layer 42 and a second insulation layer 44 conformally disposed on the first insulation layer 42, and a material composition of the second insulation layer 44 may be different from a material composition of the first insulation layer 42. For example, the first insulation layer 42 may be a silicon oxide layer, and the second insulation layer 44 may be a silicon nitride layer, but not limited thereto. Additionally, in some embodiments, the first insulation layer 42 may be regarded as a liner layer, and the second insulation layer 44 may be the main mask material. Therefore, the first insulation layer 42 may be thinner than the second insulation layer 44, and a thickness of the first insulation layer 42 in the vertical direction Z may be less than a thickness of the second insulation layer 44 in the vertical direction Z, but not limited thereto. In some embodiments, the first portion 40A of the mask pattern 40 may be composed of the first insulation layer 42 and the second insulation layer 44 disposed on the first region R1 of the semiconductor substrate 10, and the second portion 40B of the mask pattern 40 may be composed of the first insulation layer 42 and the second insulation layer 44 disposed on the second region R2 of the semiconductor substrate 10. Therefore, a material composition of the first portion 40A of the mask pattern 40 may be identical to a material composition of the second portion 40B of the mask pattern 40.

In some embodiments, a material composition of the gate structure GS may be identical to a material composition of the shielding structure SS. For example, a patterned conductive layer 24 may be disposed on the first region R1 and the second region R2 of the semiconductor substrate 10, the shielding structure SS may include a first portion 24A of the patterned conductive layer 24, and the gate structure GS may include a second portion 24B of the patterned conductive layer 24. The patterned conductive layer 24 may include an electrically conductive material containing silicon, such as a doped polysilicon material or other suitable electrically conductive material, and the patterned conductive layer 24 may be a patterned conductive polysilicon layer accordingly, but not limited thereto. In some embodiments, the radiofrequency device 100 may further include a dielectric layer 22 disposed on the first region R1 and the second region R2 of the semiconductor substrate 10, a first portion 22A of the dielectric layer 22 may be disposed between the shielding structure SS and the semiconductor substrate 10 in the vertical direction Z, and a second portion 22B of the dielectric layer 22 may be disposed between the gate structure GS and the semiconductor substrate 10 in the vertical direction Z. The dielectric layer 22 may include an oxide layer, such as a silicon oxide layer, or other suitable dielectric materials, and the second portion 22B of the dielectric layer 22 may be regarded as a gate dielectric layer.

In some embodiments, the shielding structure SS may be an electrically floating conductive structure. For example, the shielding structure SS may be completely encompassed by insulation materials (such as the first portion 40A of the mask pattern 40, the spacer structure SP1, and the first portion 22A of the dielectric layer 22 described above), but not limited thereto. In other words, the first portion 24A of the patterned conductive layer 24 and the second portion 24B of the patterned conductive layer 24 may be physically separated from each other and electrically separated from each other. Additionally, in some embodiments, the mask pattern 40 may be regarded as a blocking layer for blocking the formation of self-aligned silicide layer, and the self-aligned silicide layer may be formed on the gate structure GS without being covered by the mask pattern 40 on the second region R2 of the semiconductor substrate 10 and formed on the semiconductor substrate 10 without being covered by the mask pattern 40. For example, the radiofrequency device 100 may further include a silicide layer 52A and a silicide layer 52B. The silicide layer 52A may be disposed on the second region R2 of the semiconductor substrate 10 and directly contact the semiconductor substrate 10, and the silicide layer 52B may be disposed on the gate structure GS and directly contact the gate structure GS. The silicide layer 52A and the silicide layer 52B may include cobalt-silicide, nickel-silicide, or other suitable metal silicide.

In some embodiments, the silicide layer 52B may include a material converted from a part of the gate structure GS, but a top surface TS3 of the silicide layer 52B may be still higher than a top surface TS2 of other portions of the gate structure GS in the vertical direction Z, and a top surface TS1 of the shielding structure SS and the top surface TS2 of the gate structure GS may be located within the same plane orthogonal to the vertical direction Z, but not limited thereto. Therefore, compared with a condition where a silicide layer is directly formed on the shielding structure SS, the total electrical resistance of the semiconductor substrate 10 and the shielding structure may be increased by the first portion 40A of the mask pattern 40 covering the shielding structure SS completely for keeping the silicide layer from being formed on the shielding structure SS, and the energy loss induced by the substrate may be reduced by relatively increasing the distance between the inductor structure 70 and the shielding structure (especially when the first portion 24A of the patterned conductive layer 24 and a silicide layer formed thereon may be regarded as a shielding structure). In other words, in some embodiments, the shielding structure SS may be formed only with the polysilicon material without including the silicide described above (such as metal silicide). In addition, the Q-factor of the inductor structure 70 is proportional to the ratio of the stored energy to the energy loss in one oscillation cycle (i.e. inversely proportional to the energy loss in one oscillation cycle). The energy loss may include an energy loss induced by metal and an energy loss induced by the substrate. The energy loss induced by metal may include, for example, DC loss and loss induced by skin effect, and the energy loss induced by the substrate may include substrate potential current induced by electric field and loss induced by eddy current. Therefore, the energy loss induced by the substrate may be reduced by completely cover the shielding structure SS with the first portion 40A of the mask pattern 40 in the vertical direction Z for keeping the silicide layer from being formed on the shielding structure SS, and the Q-factor of the inductor structure 70 and the device performance of the radiofrequency device 100 may be improved accordingly.

In some embodiments, the radiofrequency device 100 may further include a dielectric layer 54 disposed on the first region R1 and the second region R2 of the semiconductor substrate 10. A first portion 54A of the dielectric layer 54 may be disposed on the first region R1 of the semiconductor substrate 10 and cover the first portion 40A of the mask pattern 40, and a second portion 54B of the dielectric layer 54 may be disposed on the second region R2 of the semiconductor substrate 10 and cover the gate structure 54, the silicide layer 52A, the silicide layer 52B, the spacer structure SP2, and the second portion 40B of the mask pattern 40. The silicide layer 52B may be disposed between the gate structure GS and the second portion 54B of the dielectric layer 54, and the silicide layer 52B may directly contact the gate structure GS and the second portion 54B of the dielectric layer 54. Additionally, in some embodiments, the radiofrequency device 100 may further include one or more contact structures 56 penetrating through the dielectric layer 54 on the second region R2 in the vertical direction Z for contacting the silicide layer 52A and the silicide layer 52B and being electrically connected with the silicide layer 52A and the silicide layer 52B. In some embodiments, the dielectric layer 54 may be used to provide a planarization effect and has to be relatively thicker accordingly. Therefore, the dielectric layer 54 may be thicker than the mask pattern 40, and a thickness of the dielectric layer 54 in the vertical direction Z may be greater than a thickness of the mask pattern 40 in the vertical direction Z, but not limited thereto.

In some embodiments, the radiofrequency device 100 may further include a dummy metal structure 62, an interconnection structure 64, and an interlayer dielectric layer ILD. The interlayer dielectric layer ILD may be disposed on the dielectric layer 54 and located on the first region R1 and the second region R2 of the semiconductor substrate 10. The dummy metal structure 62 may be disposed between the first portion 54A of the dielectric layer 54 and the inductor structure 70 in the vertical direction Z, and the interconnection structure 64 may be disposed on the second portion 54B of the dielectric layer 54. At least a part of the dummy metal structure 62, at least a part of the interconnection structure 64, and at least a part of the inductor structure 70 may be disposed in the interlayer dielectric layer ILD. In some embodiments, the dummy metal structure 62 may be an electrically floating metal structure, and the interconnection structure 64 may be electrically connected with active components (such as a transistor composed of the gate structure GS) and/or passive components on the semiconductor substrate 10.

For example, the radiofrequency device 100 may include metal layers (such as a patterned metal layer M1, a patterned metal layer M2, a patterned metal layer M3, a patterned metal layer M4, a patterned metal layer M5, and a top metal conductive layer TM shown in FIG. 1) disposed on the dielectric layer 54 and stacked in the vertical direction Z. The dummy metal structure 62 may include a first portion M11 of the patterned metal layer M1, a first portion M21 of the patterned metal layer M2, a first portion M31 of the patterned metal layer M3, a first portion M41 of the patterned metal layer M4, and/or a first portion M51 of the patterned metal layer M5. The interconnection structure 64 may include a second portion M12 of the patterned metal layer M1, a second portion M22 of the patterned metal layer M2, a second portion M32 of the patterned metal layer M3, a second portion M42 of the patterned metal layer M4, and a second portion M52 of the patterned metal layer M5. Additionally, the inductor structure 70 may include a first portion TM1 of the top metal conductive layer TM, and a second portion TM2 of the top metal conductive layer TM may be disposed on and electrically connected with the interconnection structure 64.

In some embodiments, the radiofrequency device 100 may include connection plugs (such as a connection plug V1, a connection plug V2, a connection plug V3, a connection plug V4, and a connection plug V5 shown in FIG. 1) and the above-mentioned metal layers (such as the second portion M12 of the patterned metal layer M1, the second portion M22 of the patterned metal layer M2, the second portion M32 of the patterned metal layer M3, the second portion M42 of the patterned metal layer M4, the second portion M52 of the patterned metal layer M5, and the second portion TM2 of the top metal conductive layer TM) alternately stacked and disposed in the vertical direction Z and electrically connected with one another. In addition, the dummy metal structure 62 may be an electrically floating metal structure and electrically separated from the interconnection structure 64, and the first portion and the second portion of each patterned metal layer described above may be physically and electrically separated from one another. Additionally, in some embodiments, the inductor structure 70 may be electrically separated from the second portion TM2 of the top metal conductive layer TM, and the inductor structure 70 may be electrically connected with corresponding components, such as a component formed on the second region R2 of the semiconductor substrate 10 or a component formed on an area outside the first region R1 and the second region R2 of the semiconductor substrate 10, via other portions of the patterned metal layers described above.

In some embodiments, the substrate 10 may include a silicon substrate, a silicon germanium semiconductor substrate, a silicon-on-insulator (SOI) substrate, or a substrate made of other suitable materials. The isolation structure 12 may include a single layer or multiple layers of insulation materials, such as silicon oxide, silicon nitride, or other suitable insulation materials. The dielectric layer 22 may include an oxide layer, such as a silicon oxide layer or other suitable dielectric materials. The dielectric layer 54 may include a single layer or multiple layers of insulation materials, such as silicon oxide, silicon nitride, or other suitable dielectric materials. The interlayer dielectric layer ILD may include a single layer or multiple layers of dielectric materials, such as silicon oxide, silicon nitride, silicon carbonitride, fluorosilicate glass (FSG), low dielectric constant (low-k) material or other suitable dielectric materials. The low-k material mentioned above may include a dielectric material with relatively lower dielectric constant (such as dielectric constant lower than 2.9, but not limited thereto), such as benzocyclobutene (BCB), hydrogen silsesquioxane (HSQ), methyl silesquioxane (MSQ), hydrogenated silicon oxycarbide (SiOC—H), and/or porous dielectric materials. The contact structure 56, each patterned metal layer, each connection plug, and the top metal conductive layer TM described above may respectively include a low resistance material and a barrier layer. The low resistance material described above may include materials with relatively lower resistivity, such as copper, aluminum, and tungsten, and the barrier layer described above may include titanium nitride, tantalum nitride, or other suitable barrier materials, but not limited thereto.

Figure 2:
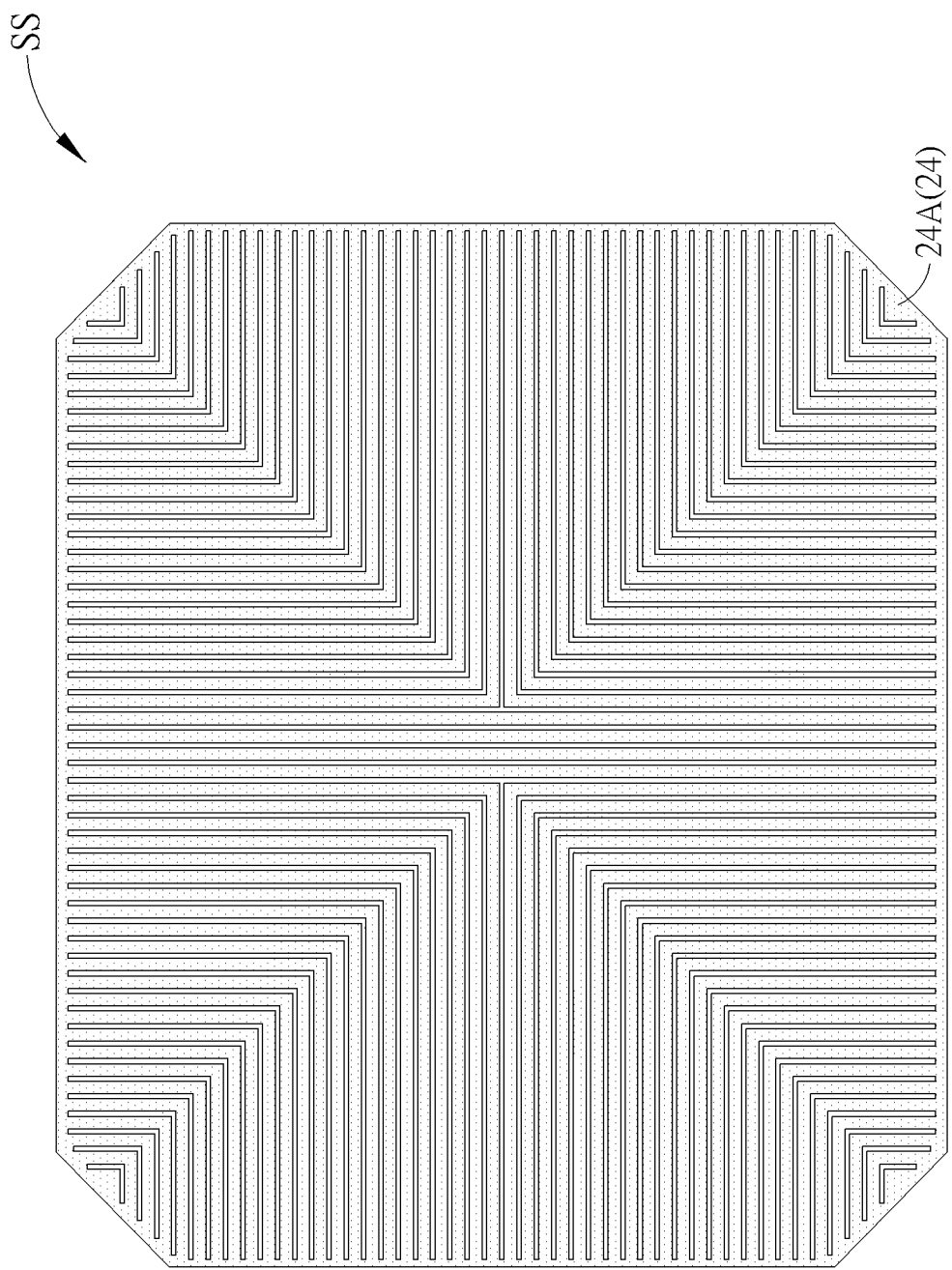
FIG. 2 is a schematic drawing illustrating a top view of a shielding structure of the radiofrequency device according to an embodiment of the present invention.
Figure 3:
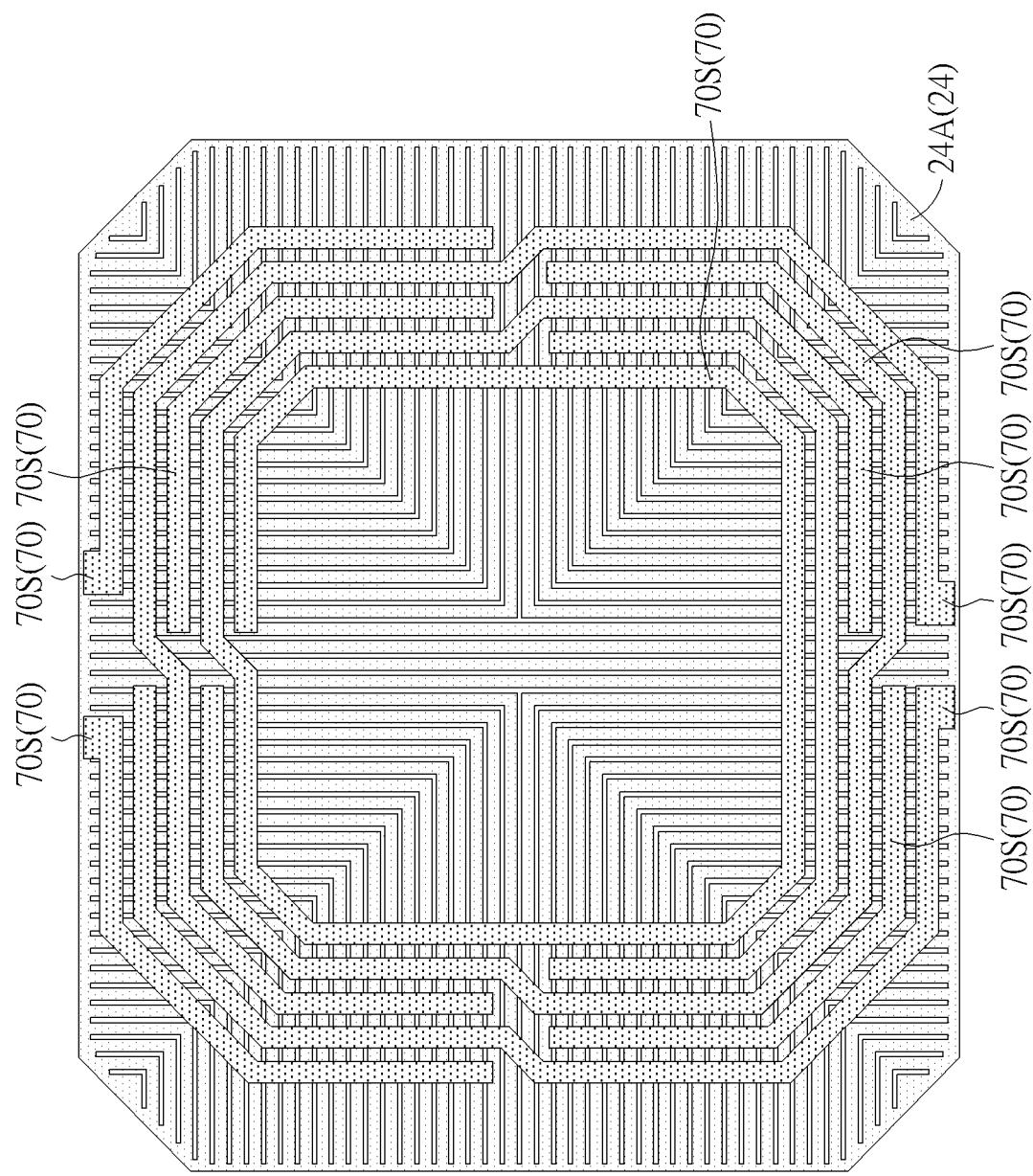
FIG. 3 is a schematic drawing illustrating a top view of a shielding structure and an inductor structure of the radiofrequency device according to an embodiment of the present invention.

Please refer to FIG. 2, FIG. 3, and FIG. 1. FIG. 2 is a schematic drawing illustrating a top view of the shielding structure SS of the radiofrequency device according to an embodiment of the present invention, and FIG. 3 is a schematic drawing illustrating a top view of the shielding structure SS and the inductor structure 70 of the radiofrequency device according to an embodiment of the present invention. As shown in FIGS. 1-3, in some embodiments, the first portion 24A of the patterned conductive layer 24 may be a pattern with mirror symmetry for uniformly controlling the shielding effect of the shielding structure SS, but not limited thereto. In addition, the inductor structure 70 may include sections 70S without being directly connected with one another, the sections 70S may be electrically connected with one another via other portions of the patterned metal layers described above or the sections 70S may be electrically connected with different components, respectively. It is worth noting that the design of the pattern of the shielding structure SS and the pattern of the inductor structure 70 in this invention is not limited to the conditions illustrated in FIG. 2 and FIG. 3, and the shielding structure SS and the inductor structure 70 with other pattern features may be applied according to other design considerations. Additionally, in some embodiments, the first region R1 may be regarded as an inductor region in the radiofrequency device 100, the second region R2 may be regarded as a circuit region in the radiofrequency device 100, and there may be not any active component (such as a transistor) disposed in the first region R1 and/or disposed above the first region R1 for reducing negative influence on the operation of the inductor structure 70.

Figure 4:
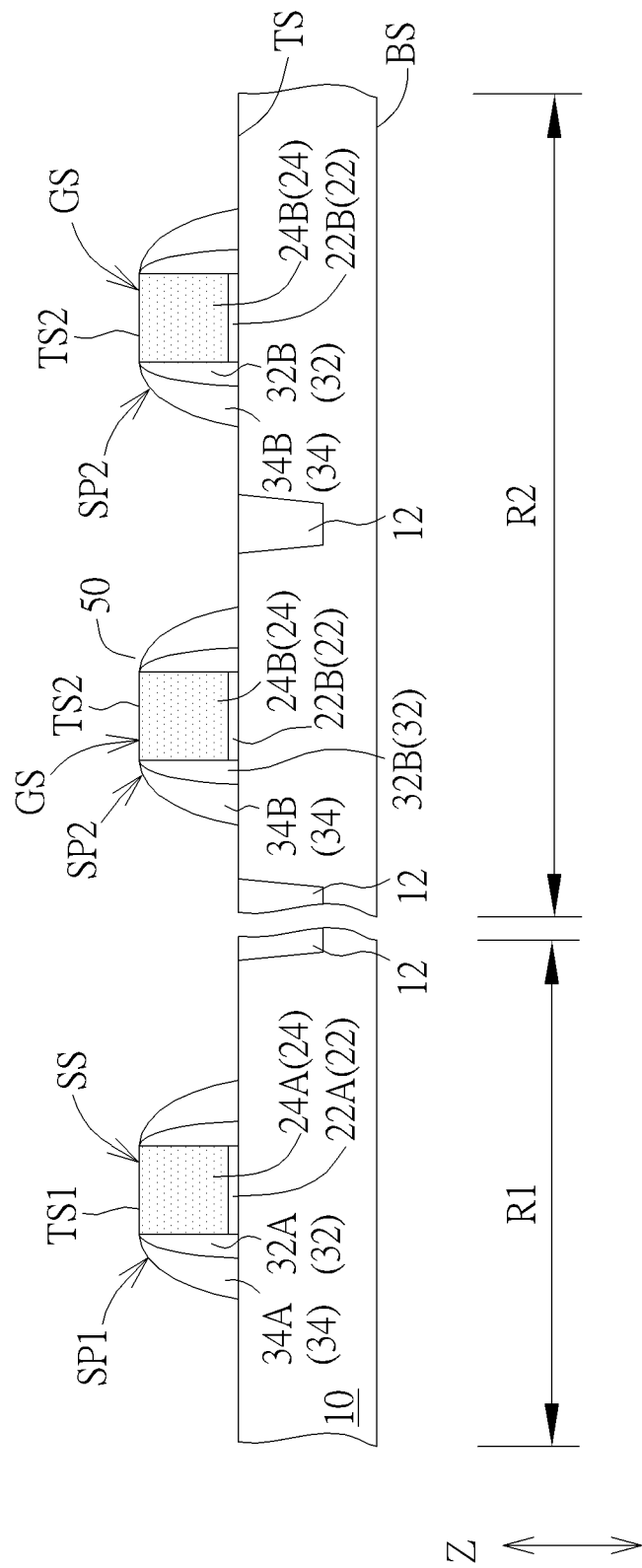
Figure 5:
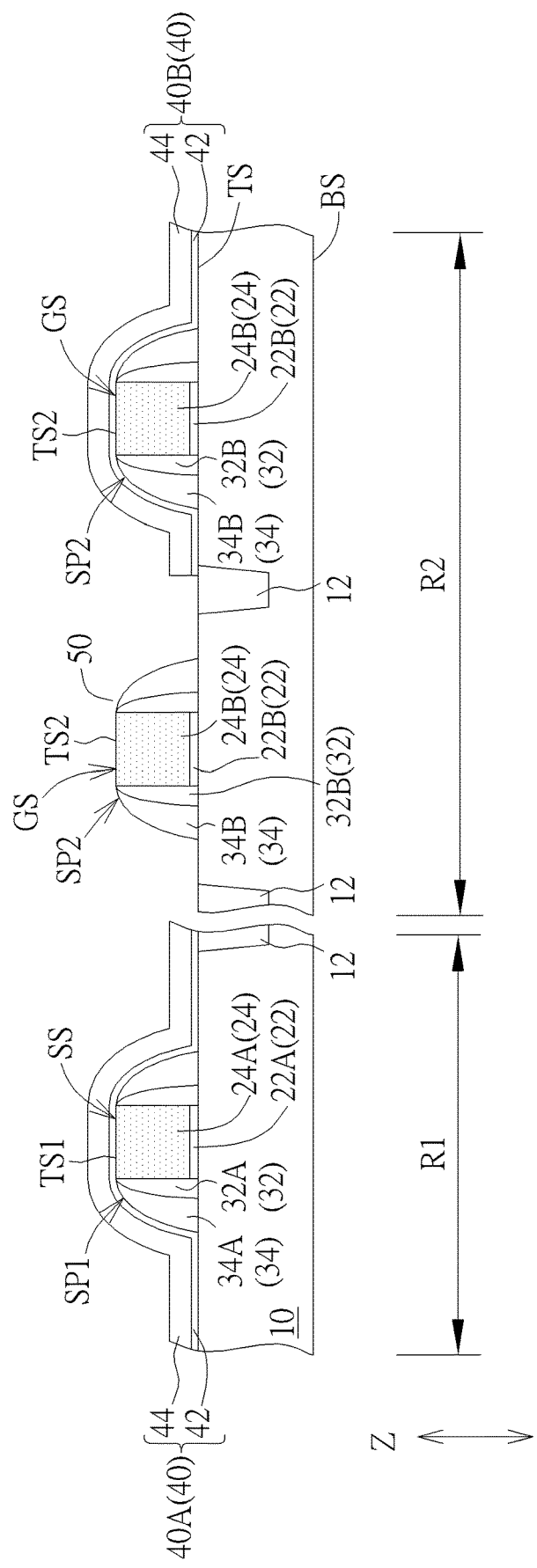
Figure 6:
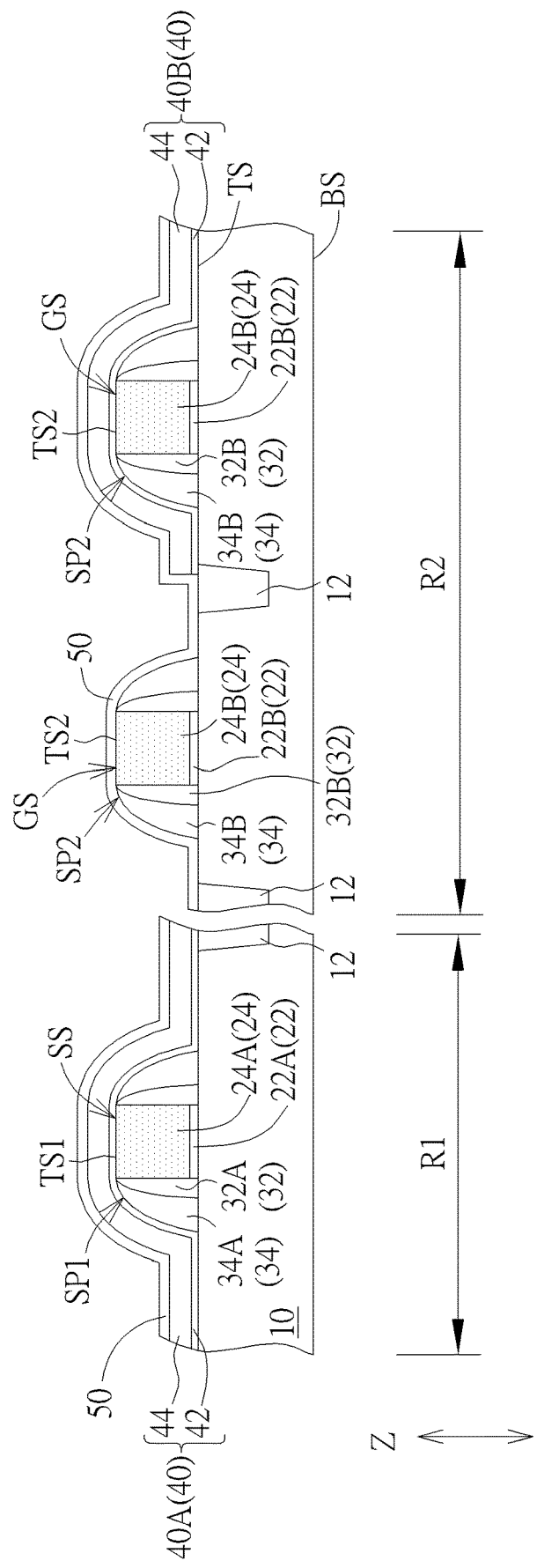
Figure 7:
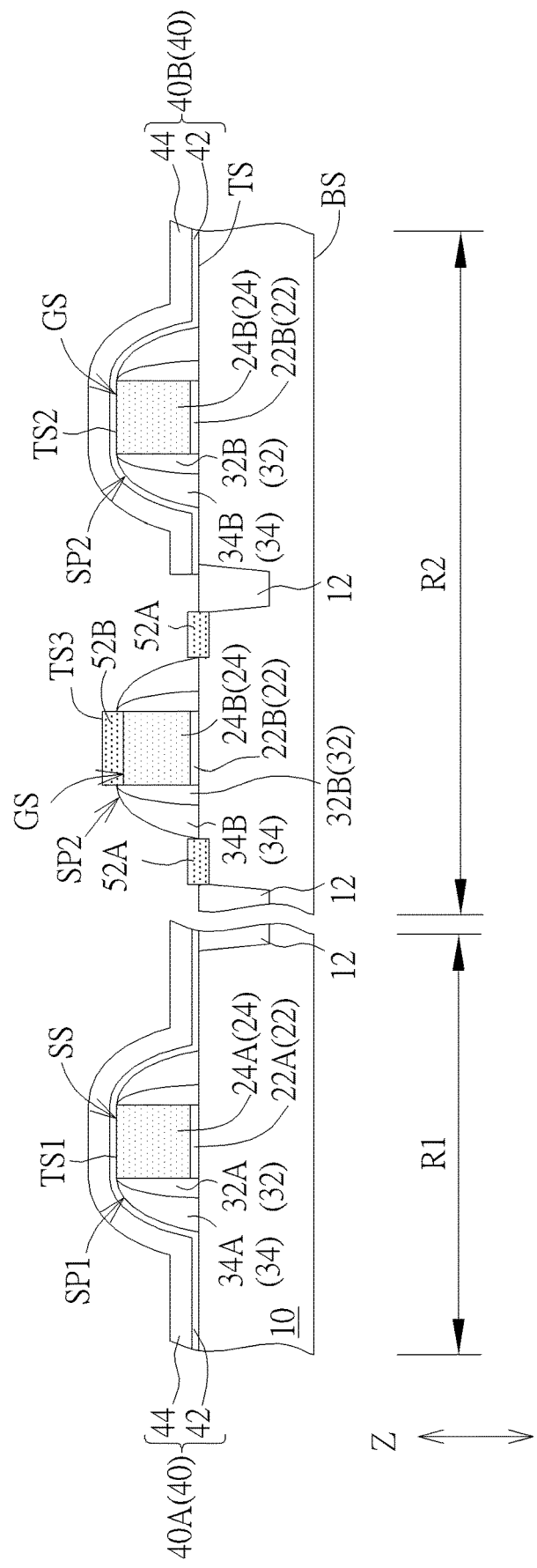

Please refer to FIGS. 4-7 and FIG. 1. FIGS. 4-7 are schematic drawings illustrating a manufacturing method of a radiofrequency device according to the first embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 1 may be regarded as a schematic drawing in a step subsequent to FIG. 7. The manufacturing method of the radiofrequency device in this embodiment may include but is not limited to the following steps. As shown in FIG. 4, the isolation structure 12, the dielectric layer 22, the patterned conductive layer 24, the first spacer 32, and the second spacer 34 may be formed on the semiconductor substrate 10. The shielding structure SS and the gate structure GS may be formed with the first portion 24A and the second portion 24B of the patterned conductive layer 24, respectively. Therefore, the shielding structure SS and the gate structure GS may be formed concurrently by the same process for simplifying the related manufacturing process, and the top surface TS1 of the shielding structure SS and the top surface TS2 of the gate structure GS may be substantially located with the same plane orthogonal to the vertical direction Z. Subsequently, as shown in FIG. 4 and FIG. 5, the mask pattern described above may be formed, and at least a part of the gate structure GS and at least a part of the second region R2 of the semiconductor substrate 10 may not be covered by the mask pattern 40.

Subsequently, as shown in FIG. 6, a metal layer 50 may be formed globally, and the metal layer 50 may directly contact the second region R2 of the semiconductor substrate 10 without being covered by the mask pattern 40 and the gate structure GS without being covered by the mask pattern 40. As shown in FIG. 6 and FIG. 7, a thermal treatment may be carried out for reacting the metal layer 50 with the gate structure GS and the semiconductor substrate 10 so as to form the silicide layer 52B and the silicide layer 52A described above, and the metal layer 50 may be removed after the silicide layer 52A and the silicide layer 52B are formed. In some embodiments, the metal layer 50 may include cobalt, nickel, or other suitable metal materials, and the silicide layer 52A and the silicide layer 52B may include cobalt-silicide, nickel-silicide, or other silicide of the metal material of the metal layer 50. Subsequently, as shown in FIG. 7 and FIG. 1, the dielectric layer 54, the contact structure 56, the interlayer dielectric layer ILD, the dummy metal structure 62, the interconnection structure 64, the inductor structure 70 and/or other required components may be formed for forming the radiofrequency device 100 shown in FIG. 1.

To summarize the above descriptions, according to the radiofrequency device in the present invention, the mask pattern may be used to cover the shielding structure underneath the inductor structure for reducing the energy loss and improving Q-factor of the inductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radiofrequency device, comprising:
   a semiconductor substrate comprising a first region and a second region;
   an inductor structure disposed on the first region of the semiconductor substrate;
   a shielding structure disposed on the first region of the semiconductor substrate and located between the inductor structure and the semiconductor substrate in a vertical direction; and
   a mask pattern disposed on the semiconductor substrate, wherein a first portion of the mask pattern is disposed on the shielding structure and directly contacts the shielding structure, and a top surface of the shielding structure is completely covered by the first portion of the mask pattern.

2. The radiofrequency device according to claim 1, wherein the shielding structure is an electrically floating conductive structure.

3. The radiofrequency device according to claim 1, wherein the mask pattern comprises a first insulation layer and a second insulation layer conformally disposed on the first insulation layer.

4. The radiofrequency device according to claim 3, wherein a material composition of the second insulation layer is different from a material composition of the first insulation layer.

5. The radiofrequency device according to claim 3, wherein the first insulation layer is thinner than the second insulation layer.

6. The radiofrequency device according to claim 1, further comprising:
   a gate structure disposed on the second region of the semiconductor substrate; and
   a first spacer structure disposed on a sidewall of the gate structure, wherein a second portion of the mask pattern is conformally disposed on the gate structure and the first spacer structure.

7. The radiofrequency device according to claim 6, wherein a material composition of the gate structure is identical to a material composition of the shielding structure.

8. The radiofrequency device according to claim 6, wherein the shielding structure comprises a first portion of a patterned conductive layer, and the gate structure comprises a second portion of the patterned conductive layer.

9. The radiofrequency device according to claim 8, wherein the patterned conductive layer is a patterned conductive polysilicon layer.

10. The radiofrequency device according to claim 6, further comprising:
    a second spacer structure disposed on a sidewall of the shielding structure, wherein the first portion of the mask pattern is conformally disposed on the shielding structure and the second spacer structure.

11. The radiofrequency device according to claim 10, wherein a material composition of the first spacer structure is identical to a material composition of the second spacer structure.

12. The radiofrequency device according to claim 6, further comprising:
    a dielectric layer disposed on the semiconductor substrate, wherein a first portion of the dielectric layer is disposed on the first region of the semiconductor substrate and covers the first portion of the mask pattern, and a second portion of the dielectric layer is disposed on the second region of the semiconductor substrate and covers the gate structure and the second portion of the mask pattern.

13. The radiofrequency device according to claim 12, wherein the dielectric layer is thicker than the mask pattern.

14. The radiofrequency device according to claim 12, further comprising:
    a silicide layer disposed between the gate structure and the second portion of the dielectric layer, wherein the silicide layer directly contacts the gate structure and the second portion of the dielectric layer.

15. The radiofrequency device according to claim 12, further comprising:
    a dummy metal structure disposed between the first portion of the dielectric layer and the inductor structure in the vertical direction.

16. The radiofrequency device according to claim 15, wherein the dummy metal structure is an electrically floating metal structure.

17. The radiofrequency device according to claim 15, further comprising:
    an interconnection structure disposed on the second portion of the dielectric layer, wherein the dummy metal structure comprises a first portion of a patterned metal layer, and the interconnection structure comprises a second portion of the patterned metal layer.

18. The radiofrequency device according to claim 17, wherein the dummy metal structure is electrically separated from the interconnection structure.

19. The radiofrequency device according to claim 17, wherein the inductor structure comprises a first portion of a top metal conductive layer, and a second portion of the top metal conductive layer is disposed on and electrically connected with the interconnection structure.

20. The radiofrequency device according to claim 19, wherein the inductor structure is electrically separated from the second portion of the top metal conductive layer.

\* \* \* \* \*